United States Patent [19]
May

[11] Patent Number: 5,834,932
[45] Date of Patent: Nov. 10, 1998

[54] WATTHOUR METER SYSTEM

[76] Inventor: Gregory R. May, 601 Plum Creek Rd., Sioux Falls, S. Dak. 57105

[21] Appl. No.: 818,359

[22] Filed: Mar. 17, 1997

[51] Int. Cl.[6] .............................. G01R 19/00; G01R 21/06
[52] U.S. Cl. ............................................. 324/107; 324/142
[58] Field of Search .................................... 324/107, 141, 324/142; 702/60, 61; 307/326; 174/5 R

[56] References Cited

U.S. PATENT DOCUMENTS

| | | | |
|---|---|---|---|
| 2,996,671 | 8/1961 | Fahrner | 324/141 |
| 3,202,916 | 8/1965 | Savastano | 324/142 |
| 4,413,230 | 11/1983 | Miller | 324/142 |
| 4,491,790 | 1/1985 | Miller | 324/142 |
| 4,615,009 | 9/1986 | Battocletti et al. | 324/141 |
| 4,675,598 | 6/1987 | Boichot-Castagne | 324/126 |
| 4,813,882 | 3/1989 | Ruiz | 439/101 |
| 4,814,996 | 3/1989 | Wang | 324/142 |
| 4,887,029 | 12/1989 | Hemminger | 324/142 |
| 4,896,106 | 1/1990 | Voisine et al. | 324/142 |
| 5,150,039 | 9/1992 | Avocat | 324/127 |

*Primary Examiner*—Ernest P. Karlsen
*Assistant Examiner*—Anh Phung
*Attorney, Agent, or Firm*—James T. FitzGibbon

[57] ABSTRACT

An electrical energy consumption measuring system is disclosed which includes a watthour meter, a meter socket, a set of voltage transformers and two plugs. The meter is energized when it is received within the meter socket. Selected socket terminals of the meter socket are electrically connected to one of the two plugs. The set of voltage transformers is electrically connected to the other of the two plugs. The system is constructed and arranged so that, when the plugs are matingly engaged, the set of voltage transformers electrically isolates the windings internal to the watthour meter from the service voltage of the power system.

40 Claims, 4 Drawing Sheets

WATTHOUR METER SYSTEM

BACKGROUND OF THE INVENTION

The present invention relates generally to watthour meter systems and the like for measuring the energy consumed by loads connected to the lines of power systems. More particularly, the invention relates to new devices that may be included in watthour meter systems. These devices limit the current through and/or reduce the voltage applied to the voltage sensing circuits and power supply in a watthour meter during measurement of the energy consumed by loads connected to the lines of power systems. This new device also consolidates the number of designated ANSI forms required for revenue watthour meter applications and thereby reduces the hazards and the costs associated with the performance, manufacture and use of these systems.

The related art watthour meter systems, although useful for certain applications, do not achieve the benefits and advantages derived from the structure and operation of the present invention, for two primary reasons. First, the related art systems include too many designated ANSI forms for the different watthour meter applications. Second, during operation of the watthour meter in these systems, hazardous conditions may develop that could result in explosion of the meter, thereby causing personal injury and/or property damage to nearby persons and property.

Those skilled in the art have already recognized the long-felt need to consolidate the number of required ANSI forms for watthour meter applications. For instance, in 1992, ABB Power T & D Co., Inc. (ABB) designed its Alpha™ meter which was the first commercially available wide voltage range solid state watthour meter. The Alpha™ meter permitted the use of the same basic watthour meter for several different watthour meter applications. In particular, the Alpha™ meter was capable of measuring the energy consumed by power systems having voltages varying from 120 $V_{rms}$ to 480 $V_{rms}$.

Through implementation of wide voltage range input meters such as the Alpha™ meter, a Form 9S meter can replace a Form 8S meter (in most applications) and a Form 16S meter can replace Form 14S and Form 15S meters. Those skilled in the art recognize that the form designation (i.e., the form number) defines whether the meter is a self-contained meter or a meter requiring an instrument rated transformer(s). The form number also designates the number of voltage sensors, current circuits and external circuit connections for the meter included in the watthour meter system.

The Form 9S watthour meter is an instrument transformer rated watthour meter which may be utilized in three phase, four wire power systems to measure the energy consumed by a connected load. In a typical arrangement, the Form 9S meter will have three instrument rated current transformers (CT's) and possibly voltage transformers (VT's) external to the meter. These transformers reduce the current flow through the meter and reduce the voltage to the meter during operation thereof. The CT's also provide isolation from the line voltages. Instrument transformer rated meters, such as the Form 9S meter, are typically used to measure the energy in high-voltage and/or high-current circuits. It would be difficult and/or impractical to build self-contained meters for measurement of energy consumption in these high energy circuits. Given the high current level and/or high voltage, a meter of extremely large size would be required to insulate a self-contained meter and/or manage the high current levels. Self-contained meters for these applications would consequently be very expensive to build and may also expose the lineman/technician servicing or inspecting the meter to the hazards of high voltage.

Therefore, instrument transformer rated watthour meters are normally used in these applications. The instrument transformers included in these applications isolate the meter from the high-voltage circuits and reduce the primary voltages and currents applied to the meter to lower, standard values that easily may be measured with meters having a common secondary rating. The instrument transformers used in these applications deliver accurately known fractions of the primary voltages and currents to the meters during operation thereof. With proper register ratios (for induction watthour meters) or digital multipliers (for solid state watthour meters), the meters can be adapted to measure the energy consumed by loads connected to these high-voltage and/or high-current circuits.

As noted above, the Form 9S meter may replace the Form 8S meter in a variety of applications when a wide voltage range input meter (hereinafter "WVRI meter") is used. Under the related art watthour meters, the Form 8S meter is an instrument transformer rated meter used in three phase, four wire delta power systems to measure the energy consumed by a connected load. The Form 8S meter has two voltage sensing windings both of which are internal to the meter. Similarly, through the use of a WVRI meter, a Form 16S watthour meter eliminates any desire to use the compromise Form 14S and Form 15S watthour meters in a variety of applications, particularly when an induction watthour meter is used. A Form 16S watthour meter is a self-contained meter used in three phase, four wire power systems to measure the energy consumed by a connected load. A Form 16S meter has three voltage sensing windings which are internal to the meter. Similar to a Form 16S meter, Form 14S and Form 15S watthour meters are also self-contained meters used in three phase, four wire power systems. A Form 14S meter is used to measure the energy consumed from a four wire wye source in those power systems. On the other hand, a Form 15S meter is used to measure the energy consumed from a four wire delta source in those systems. The primary difference between a Form 16S watthour meter and Form 14S and Form 15S watthour meters is that Form 14S and Form 15S watthour meters both have only two voltage sensing windings which are internal to the meters.

As a result of these replacements, the number of forms required to measure the energy consumed by loads connected to power systems was reduced substantially. This reduction in the number of forms is generally referred to as forms consolidation. The forms consolidation capability of its Alpha™ meter gave ABB a significant advantage in the marketplace for watthour meter systems of the related art. Other manufacturers followed ABB's lead and subsequently introduced their own wide voltage range input watthour meters. Several of these manufacturers included their own enhancements to their meters and achieved various degrees of success in the marketplace. Nevertheless, the long-felt need for forms consolidation has yet to be taken to its logical conclusion. As will be described below in greater detail, the present invention fulfills this long-felt need of the related art.

Another well-recognized deficiency of the related art systems is the potential for hazards resulting from operation of the watthour meters. In the most apparent context, self-contained meters might malfunction after the occurrence of a catastrophic phase-to-phase and/or phase-to-ground fault, possibly causing explosion of the meter itself. The meter may explode with great force and hence may potentially cause serious personal injury and/or property damage.

The related art self-contained meters have voltage sensing windings which are internal to the meter. These voltage sensing windings and power supplies (in the case of a solid state meter and/or register) are not isolated from the high-voltage power systems by instrument transformers or similar devices. The internal connections of these meters are often sufficiently closely spaced to permit, under extreme conditions, a phase-to-phase and/or a phase-to-ground fault during operation of the meter. This unconfined explosion of the meter might also spread to the meter socket and its associated wiring, as it has been known to do. Furthermore, cracking or deterioration of the material forming the base of the meter and/or failure of the socket insulation are other potential results of such a meter malfunction.

In addition to the above-referenced hazards, other potential hazards are present in related art watthour meter systems, particularly those that include so-called MOV arrestors connected internally to the line side of self-contained meters. These metal oxide varistor (MOV) arrestors are intended to clamp the applied voltage down to a suitable level when a fault occurs in the electrical power system itself and thus limit the voltage build up within the voltage circuits of the meter. Accordingly, the voltage does not usually reach a dangerous level. However, under extreme conditions, such as lightning strikes or other overvoltage conditions, an unexpected result can occur. This happens when the metal oxide, which is itself somewhat electrically conductive, is vaporized by the high current levels caused by the high voltage. This actually creates a conductive atmosphere within the housing of the meter, which may inadvertently cause a catastrophic phase-to-phase and/or phase-to-ground fault condition between terminals. Therefore, although the use of the arrestor within the related art devices is intended to, and usually does, protect the system, the use of the arrestor may in some cases actually render the system more hazardous, particularly in self-contained watthour meter applications.

The above-noted dangers are particularly apparent in 480 $V_{rms}$ three phase, self-contained watthour meter applications, often considered by those skilled in the art to be the most hazardous applications. Many power utility companies have established safety regulations and other procedures to limit the potential risk of injuries and damage resulting from the hazardous conditions of these applications. For instance, under the related art systems, many utilities require that the entire installation be disconnected before even routine meter changeouts are performed by a lineman.

This disconnection of the entire installation is not practical in certain circumstances, such as when the power system provides energy for a whole shopping center, for example. Under circumstances such as this, it is impractical for the service to be disconnected for performance of basic operations such as a routine meter changeout. Thus, the utility is forced under the related art to use an instrument transformer rated meter in these applications and to install a full set of voltage and current instrument transformers.

These and other deficiencies of the related art systems have induced meter manufacturers, socket manufacturers, utilities and test equipment manufacturers to search for alternative designs for watthour meters and/or alternative methods for measuring the energy consumed by loads connected to electrical power systems. Under the related art, the costs associated with the substantial number of forms needed to measure energy consumption in the wide range of applications is felt by all of the above-identified entities. Furthermore, the potential liability resulting from operation of the related art watthour meters is a continuing concern for these entities. It is therefore a long-felt need to consolidate the number of forms for watthour meter applications and to reduce the probability of dangerous conditions resulting from operation of these meters.

In particular, in order to provide for watthour meters that accurately measure energy consumption in each of the wide variety of possible applications, the industries of the related art have had to establish a variety of different forms, often an independent form for each given application. The many required form designations have resulted in substantial costs to manufacturers, distributors, and utilities. These costs include those attributable to manufacturing, tooling, inventorying and marketing many meter forms. Perhaps even more significant, liability, service, and warranty costs imposed on meter manufacturers and utilities have been substantial, due to the history of accidents resulting from operation of the related art watthour meters. Furthermore, under the related art, socket manufacturers have incurred increasing costs due to the large number of socket types that are necessary to connect the various forms of watthour meters with the electrical power system.

Moreover, the necessity of using instrument transformer rated watthour meters instead of self-contained watthour meters in certain applications has forced utilities to pay for system components and to pay further for the more frequent testing required for compliance with the regulations of public utility commissions (PUC) when the utility uses instrument transformer rated watthour meters.

Finally, test equipment manufacturers also recognize the high costs associated with use of the related art watthour meters. In particular, under the related art, test equipment manufacturers have been required to design and build test equipment which is complex and which further is costly to test meter installations.

The present invention overcomes these prior art deficiencies by reducing the costs and potential hazards associated with the production and operation of multi-phase watthour meters.

The present invention uses a set of small, accurate electrically isolating voltage transformers which may be included within existing watthour meter systems. In a three phase power system, the inclusion of three small accurate isolating voltage transformers is sufficient to carry out the principles of the present invention. These voltage transformers are preferably designed to be fabricated into a set of three such transformers. This set of voltage transformers is designed to reduce the voltage applied to and/or limit the current available to the voltage portion of a watthour meter during operation thereof, thereby reducing the potential hazards associated with such operation.

To establish electrical connectivity between the set of voltage transformers and the voltage sensing windings and power supply which are internal to the meter, additional structure including, among other things, two connection devices such as plugs or the like are included. For purposes of this specification and the appended claims, the terms plug and jack will be used interchangeably. Accordingly, those two terms should be similarly construed. One of the plugs is connected to the set of voltage transformers; the other plug is connected to predetermined socket terminals of the meter socket.

When the plugs are matingly engaged, the three accurate isolation voltage transformers are connected to the internal voltage sensing windings and power supply of the watthour meter, assuming the meter is received in the meter socket. Each internal voltage sensing winding of the watthour meter has its own independent voltage transformer connected in parallel with it when the watthour meter system is in operation. These voltage transformers are external to the watthour meter but may be contained within the socket box or their own housing. Nevertheless, the voltage is reduced and/or the current is limited external to the meter during operation thereof.

An important feature of the present invention is the isolation of the voltage measuring circuitry of the watthour meter from the current measuring circuitry of that meter, particularly when the meter is a self-contained meter. As noted above, the present invention introduces voltage reducing and/or current limiting devices that isolate the voltage sensing windings which are internal to the watthour meter from the lines of the power system. This, in turn, increases the level of safety during operation of the watthour meter which, as described above, is particularly important for applications such as those measured by 480 $V_{rms}$ three phase self-contained watthour meters and the like.

At first glance, however, those skilled in the art may not appreciate the consolidation of forms resulting from the present invention. The invention carries the principle of forms consolidation to its logical conclusion. In particular, the number of forms necessary to meter common three phase applications has now been reduced from five (under the related art) to one. This one form would preferably comprise two models, one model for a class 20 instrument transformer rated watthour meter application (the conventional Form 9S watthour meter application) and the other model for a class 200 (or 320) self-contained watthour meter application. Those skilled in the art will appreciate that the class designation of a particular watthour meter denotes the maximum amperage capability of the current measurement circuitry.

Additionally, with the present invention, a self-contained watthour meter now may be used in circumstances wherein an instrument transformer rated watthour meter has been required under the related art systems. It is contemplated by the inventor that the differentiation of the class 200 (or 320) watthour meter from the conventional class 20 watthour meter may require the establishment of a new ANSI form number. It is further recognized that the placement of a class 20 watthour meter in an application requiring the use of a class 200 (or 320) watthour meter might yield undesirable results. Therefore, the inventor has contemplated that a key device, such as those well known in the art, may be included in the design of the meter mounting device for the present invention to prevent the insertion of a class 20 Form 9S meter into a self-contained socket. Furthermore, as has already been done with certain related art systems, another, but different, key device could be included in the design of class 200 watthour meters for the present invention to prevent their insertion into a socket of the type utilized in class 320 applications.

With the forms consolidation provided by the present invention, the number of sockets required for all three phase watthour meter applications would be reduced to only two. One socket would be used for class 20 instrument transformer rated watthour meter applications and the other socket would be used for class 200 (or 320) self-contained watthour meter applications. Perhaps most importantly, both sockets could have 13 terminals. In the socket used for class 20 instrument transformer rated watthour meter applications, a lever bypass is typically included within the meter housing to provide a positive shorting system for current transformer secondaries, thereby allowing the watthour meter to be safely removed. The sockets utilized for class 200 (or 320) self-contained watthour meter applications, on the other hand, typically have a sturdy bypass which provides a "make before break" switch action, allowing the watthour meter to be changed without the undesirable interruption of service to the consumer.

In effect, the present invention consolidates the number of forms required for the various watthour meter applications and limits the potential hazards that may result from operation of those watthour meters, particularly for class 200 or class 320 self-contained applications. The functions of the present invention may be carried out with structures other than the set of voltage transformers described above. Those skilled in the art will appreciate that such additional structures are merely equivalents of the structure disclosed in the present specification and thus fall within the scope of the appended claims.

Another feature of the present invention is the optional connection of a metal oxide varistor (MOV) to the line side of the power system. In one embodiment, the MOV arrestor may be wye connected to the line side of the watthour meter. The MOV arrestor provides a significant level of protection against lightning and other phenomena which can cause high voltage surges. This, in turn, provides an additional level of safety above and beyond that level provided by the set of electrical isolation devices.

A further feature of the present invention is that it permits self-contained meters, such as class 200 watthour meters, to maintain their classification as self-contained watthour meters during testing of those meters. Since the set of voltage transformers in the preferred embodiment of the invention is designed to be fabricated into a unitary set with a cable and a plug permitting easy installation and changeout with the socket for the meter, the entire set may easily be tested along with the meter to give an overall accuracy reading of the system. As is well known by those skilled in the art, most public utility commissions require a self-contained meter to maintain its characterization as a self-contained meter during testing of the device. The inventor believes that the ability to test the set of voltage transformers along with the meter should be in compliance with the regulations of most public utility commissions. This retained classification as a self-contained meter during testing is significant since most regulatory agencies require utilities to test instrument transformer rated watthour meters more frequently. Thus, the present invention saves time and money for these utilities.

Another feature of the present invention is the inclusion of a jumper which is connectable with the plug that is connected to the socket terminals of the meter socket. That plug may therefore be connected to either its counterpart plug or the jumper. The jumper permits the watthour meter to be used without the set of voltage transformers. This is useful since utilities might find it undesirable to include the set of voltage transformers within the system because, for example, the particular application merely requires low service voltages or the particular utility prefers to use systems resembling those of the related art. It is contemplated that the meter socket for a particular watthour meter application may be initially purchased without the set of voltage transformers. The voltage transformers could be purchased later and added to the watthour meter system if the utility chooses to do so. Alternatively, the voltage transformers might be available with the socket at an additional cost. Therefore, the inclusion of the jumper allows the public utility to adapt the watthour meter system to its own practices.

A further benefit of the invention is that the plug connected to the electrical isolation devices and the jumper may be disconnected from the plug connected to the socket terminals if the utility desires to de-energize the voltage portion of the system for meter changes, tests or the like.

As will be appreciated by those skilled in the art, the advantages and benefits derived by the use of the present invention are numerous. In particular, entities such as meter manufacturers, socket manufacturers, utilities and test equipment manufacturers will all reap benefits from this invention. Some of these benefits are described in the following paragraphs.

Under the present invention, manufacturers will only need to produce one form for a three phase watthour meter. Although the instrument transformer rated watthour meter and the self-contained watthour meter versions of this form will probably have different form designations, the distinction is only technical since, at most, only the rating of the current sensor windings which are internal to these meters will need to be changed. As a result, the costs to manufacture, produce, and market these watthour meters will be reduced. Furthermore, the need to inventory meters of varying form designations will be eliminated under the present invention. Thus, meter manufacturers will save time and storage space as a result of this forms consolidation. Perhaps most important, the present invention reduces the hazards associated with watthour meters, particularly self-contained watthour meters. Both liability and warranty costs to meter manufacturers will be reduced.

Under the present invention, socket manufacturers will also recognize the significant benefits derived therefrom. The present invention reduces the number of socket types necessary to measure the energy consumed by loads in three phase watthour meter applications. Therefore, socket manufacturers will only need to produce a limited number of socket types and will save significant costs associated with the production of these sockets.

Perhaps most apparent, under the present invention, utilities will recognize the significant advantages thereof. The forms consolidation feature of the present invention will reduce the inventory requirements for both watthour meters and sockets since only a few specified forms and types will be required. Furthermore, significant savings will result when new services are installed since the new services will no longer require several different forms and/or the use of costly components such as instrument transformers, for example.

The utilities will also achieve significant cost savings since only one basic form of watthour meter will need to be tested through use of the present invention. Moreover, savings will be achieved when applications which would typically require use of an instrument transformer rated watthour meter under the related art are now reclassified as self-contained watthour meter applications. On a similar note, those self-contained watthour meters will not need to be tested as often as their counterpart instrument transformer rated watthour meters, thereby further resulting in savings based on the avoidance of test costs. Meter changeout procedures can be potentially streamlined due to the increase in safety levels associated with these meters under the present invention. This will further protect employees of the utilities and protect the person and/or property of others from the potential damage resulting from meter malfunction. Therefore, liability costs will be significantly reduced for the utilities.

Finally, test equipment manufacturers will recognize the benefits obtainable through use of the present invention. The forms consolidation feature of the present invention will allow test equipment manufacturers to produce simpler methods for testing the single three phase meter form contemplated by the present invention. Furthermore, existing test equipment can be easily modified to test the small voltage transformers along with the watthour meter itself.

Perhaps most important, the public will recognize the significant benefits obtained through use of the present invention. The safety hazards inherent in the design of the related art watthour meters have been known to cause personal injury and/or property damage when those meters malfunction. The present invention increases the safety level of watthour meters in all applications.

It should therefore be appreciated that the present invention benefits a wide variety of groups. Therefore, it is contemplated that the present invention will be highly marketable since it has satisfied long-felt, but unresolved needs of the related art.

It is an object of the present invention to consolidate the required number of form designations for watthour meters necessary to accurately measure the energy consumed by loads connected to electrical power systems in a variety of applications.

It is another object of the present invention to increase the level of safety for all types of watthour meters.

It is a further object of the present invention to provide a set of electrical isolation devices which consolidates the required number of form designations for watthour meters.

It is yet another object of the present invention to provide a set of electrical isolation devices which further increases the level of safety for watthour meter systems.

It is still another object of the present invention to provide an independent set of voltage transformers which consolidates the number of form designations for watthour meter systems and further increases the level of safety for such systems.

It is yet another object of the present invention to provide a set of three voltage transformers which, when connected in parallel to the voltage sensing windings internal to a watthour meter, accomplish the foregoing objects.

The manner in which the foregoing and other objects and advantages are achieved in practice will become more clearly apparent when reference is made to the following detailed description of the preferred embodiments of the invention set forth by way of example and shown in the accompanying drawings wherein like reference numbers indicate corresponding parts throughout.

SUMMARY OF THE INVENTION

An electrical energy consumption measuring system is claimed which includes an electrical meter. The electrical meter has both voltage sensing windings and current sensing windings internal thereto. The voltage sensing windings are each constructed and arranged so that the electrical meter may measure a first voltage appearing across that voltage sensing winding and determine a second voltage appearing across at least two lines of an electrical circuit system. Each current sensing winding of the electrical meter is constructed and arranged so that the electrical meter may measure a first current driven through that current sensing winding and determine a second current driven through a line of the electrical circuit system.

The electrical energy consumption measuring system further includes a meter socket. The meter socket is adapted to receive the electrical meter. The meter socket includes a plurality of socket terminals which are designed to receive a plurality of conductor lugs included with the electrical meter when the conductor lugs are in registry with the socket terminals.

The system further includes a first plug having a plurality of nodes. The first plug carries several conductors which electrically connect a given one of the nodes with one of the meter socket terminals.

The system further includes an electrical isolation device which is electrically connected with a second plug having a plurality of nodes. Several conductors electrically connect nodes of the second plug with the electrical isolation device.

The first plug and the second plug are constructed and arranged such that, when they are connected to each other and the electrical meter is energized, the electrical isolation device isolates the voltage sensing windings of the electrical meter from the electrical circuit.

In another embodiment of this invention, the electrical isolation device comprises a set of voltage transformers.

DESCRIPTION OF THE PREFERRED EMBODIMENTS OF THE INVENTION

Figure 1:
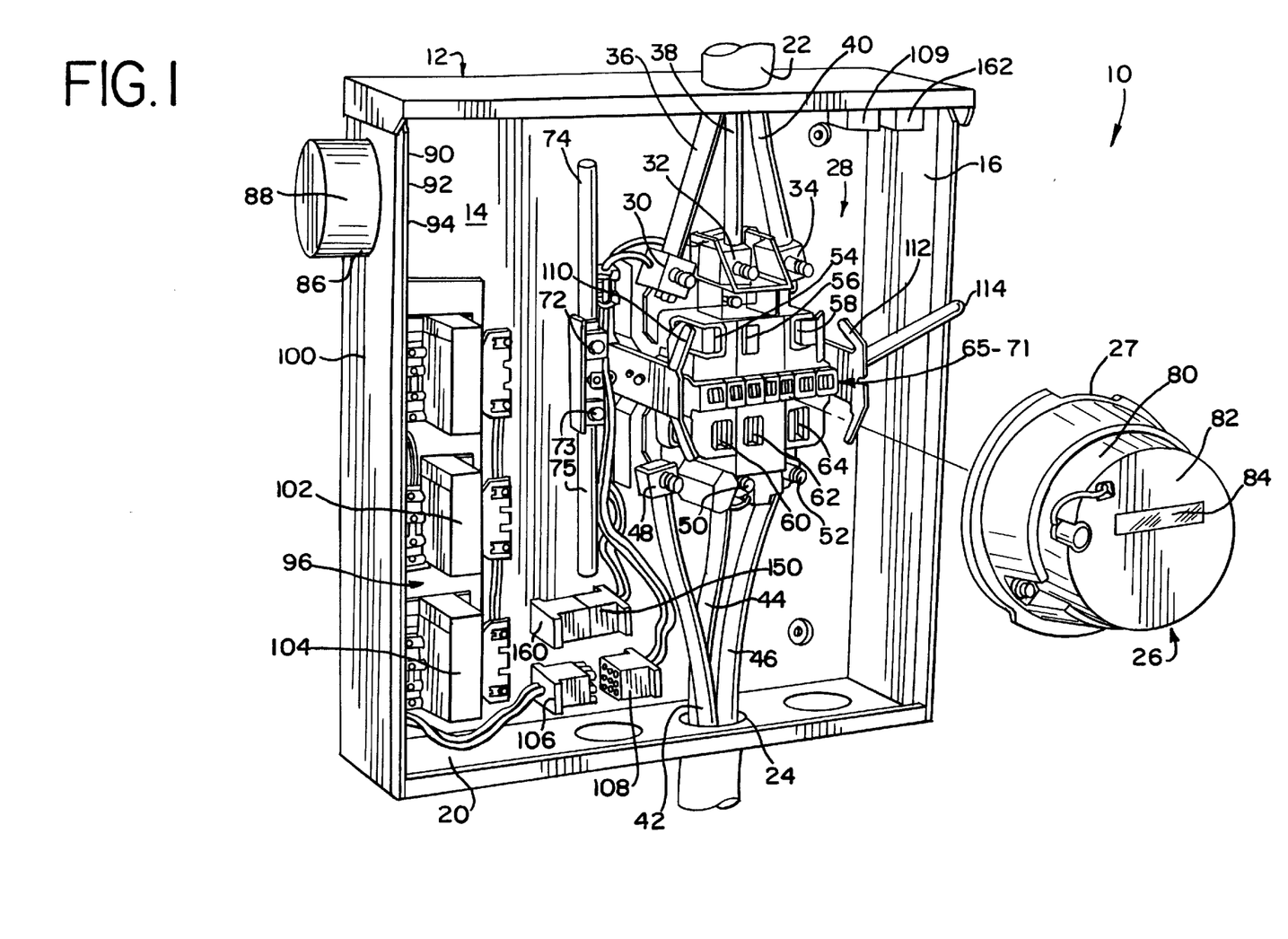
FIG. 1 is a perspective view of an energy consumption measuring system constructed in accordance with the present invention having parts thereof shown in explosion and including a set of three electrical isolation transformers.

While it will be understood that the invention may be embodied in different forms and use different materials in its construction, reference will be made to two preferred embodiments of the invention adapted for somewhat different applications. Thus, FIG. 1 is a perspective view of an energy consumption measuring system made according to the invention and which is best understood in connection with the schematic illustration appearing in FIGS. 3A and 3B.

According to one form of the invention, the energy consumption measuring system generally designated 10 is shown to be mounted within a box generally designated 12 and shown to include a rear mounting panel 14 held to a substrate by fasteners 15, a pair of opposed sidewalls 16 and top and bottom wall panels 18, 20 respectively. One or more openings 22, 24 may be formed in the top and bottom wall panels 18, 20 respectively of the box 12 to permit conductors to pass therethrough.

It is also understood that the box 12 will have a cover (not shown) which includes an opening adapted to permit a portion of the watthour meter cover to extend through for purposes of meter reading and otherwise.

Referring again to FIG. 1, it is shown that the energy consumption measuring system 10 includes as principal components a self-contained watthour meter assembly generally designated 26, with such assembly 26 including a base 27 that is normally received in use within a meter socket generally designated 28 and shown to include three line-side conductor terminals 30, 32, 34. Each terminal 30, 32, 34 is connected to a line-side conductor 36, 38, 40 physically connecting the power system to a load (not shown). Three load-side conductors 42, 44, 46 are shown to be associated respectively with load-side conductor terminals 48, 50, 52 forming a lower portion of the meter socket 28.

As is conventional, the meter socket 28 includes an array of upper socket terminals 54, 56, 58 and an array of lower socket terminals 60, 62, 64, each forming counterpart pairs with the upper socket terminals 54, 56, 58, respectively. Each of the socket terminals in use accommodates a counterpart lug (not shown) extending outwardly from the rear end face of the meter base 27. In addition, the meter socket 28 includes seven additional socket terminals 65–71. Terminal 71 is a neutral/ground socket terminal, and when the conductor lugs of the meter assembly are received within the socket terminals, three of the additional socket terminals 65, 66, 67, along with the neutral/ground socket terminal 71, are electrically connected to voltage sensing windings through their associated conductor lugs of the self-contained watthour meter assembly 26. The other three additional socket terminals 68–70 are for purposes of connection to test lugs or for other auxiliary functions.

As shown in FIG. 1, it is conventional for the meter socket 28 to further include a pair of terminals 72, 73 to be provided for connection to line-side and load-side neutral conductors 74, 76, respectively. For purposes of clarity, these conductors are shown as broken off in FIG. 1; it is understood that their other ends would normally be connected to the line and the load, respectively.

Referring now to other elements illustrated in FIG. 1, in addition to its base 27, the meter assembly 26 is shown to include a housing portion 80 having a front face 82 with a window 84 positioned therein to permit reading of the meter. It is understood that the base 27 and the housing assembly 80, as well as the inner workings of the meter are surrounded by a cover (not shown) made from a polycarbonate ("Lexan") or other impact resistant plastic material.

Referring still to FIG. 1, additional elements are shown including a generally cylindrical holder 86 for a metal oxide varistor ("MOV") having conductors 90, 92, 94 shown truncated or broken away for clarity. It is understood that the various terminals of the MOV are wye-connected to the appropriate line-side conductor terminals 30, 32, 34 of the meter socket 28.

Referring again to FIG. 1, another important element of the invention is shown, namely, a matched set of electrical isolation devices generally designated 96, in this case comprising three individual isolation voltage transformers 100, 102, 104. Each transformer, as will appear, includes plural electrical conductors, with each conductor having one of its ends connected to one winding of the transformer and its other end terminating in a respective node of a plug 106, the plug 106 being adapted to mate with a plug 108. The plug 108 includes plural conductors, with each conductor having one of its ends connected to a respective node of that plug and its other end connected to an appropriate socket terminal so that plug 108 is in electrical communication with line-side conductors 36, 38, 40 and with neutral/ground conductor 76, as can further be seen in the schematic diagram of FIG. 3B. As will also appear, when the plugs 106, 108 are mated, the isolation transformers 100, 102, 104 are in operative association and each is in parallel with a corresponding voltage sensing winding within the self-contained meter assembly 26, assuming the meter is received within the socket as it is during operation thereof.

Referring now to another feature of the invention, a "jumper" or a "bypass element" 109 is shown as it is when positioned for storage, i.e., it is removably secured to a lower surface of the top panel 18 of the box 12. In an alternate position, the jumper 109 permits the meter to operate without connection to the electrical isolation transformers 100, 102, 104.

Referring now to other physical details of the meter socket 28, a pair of opposed, base mounting brackets 110, 112 are provided for stiff but resilient connection to the outer margin of the meter base 27 in a manner known to those skilled in the art. The brackets 110, 112 assist in aligning the meter base such that the conductor lugs extending from the rear face of base 27 register with the socket terminals of the meter socket 28. The mounting brackets add mechanical strength to the assembly but the base is removable therefrom under a suitably applied non-destructive force.

In FIG. 1, there is also shown a lever 114 that operates a so-called disconnect. When the handle of the disconnect is appropriately positioned, the current is shunted or bypassed so as to be in parallel with the current windings in the meter. The lever also actuates a current jaw release mechanism for the current jaws. These two features of lever 114 permit the meter to be removed without danger under normal circumstances.

Figures 3A, 3B:
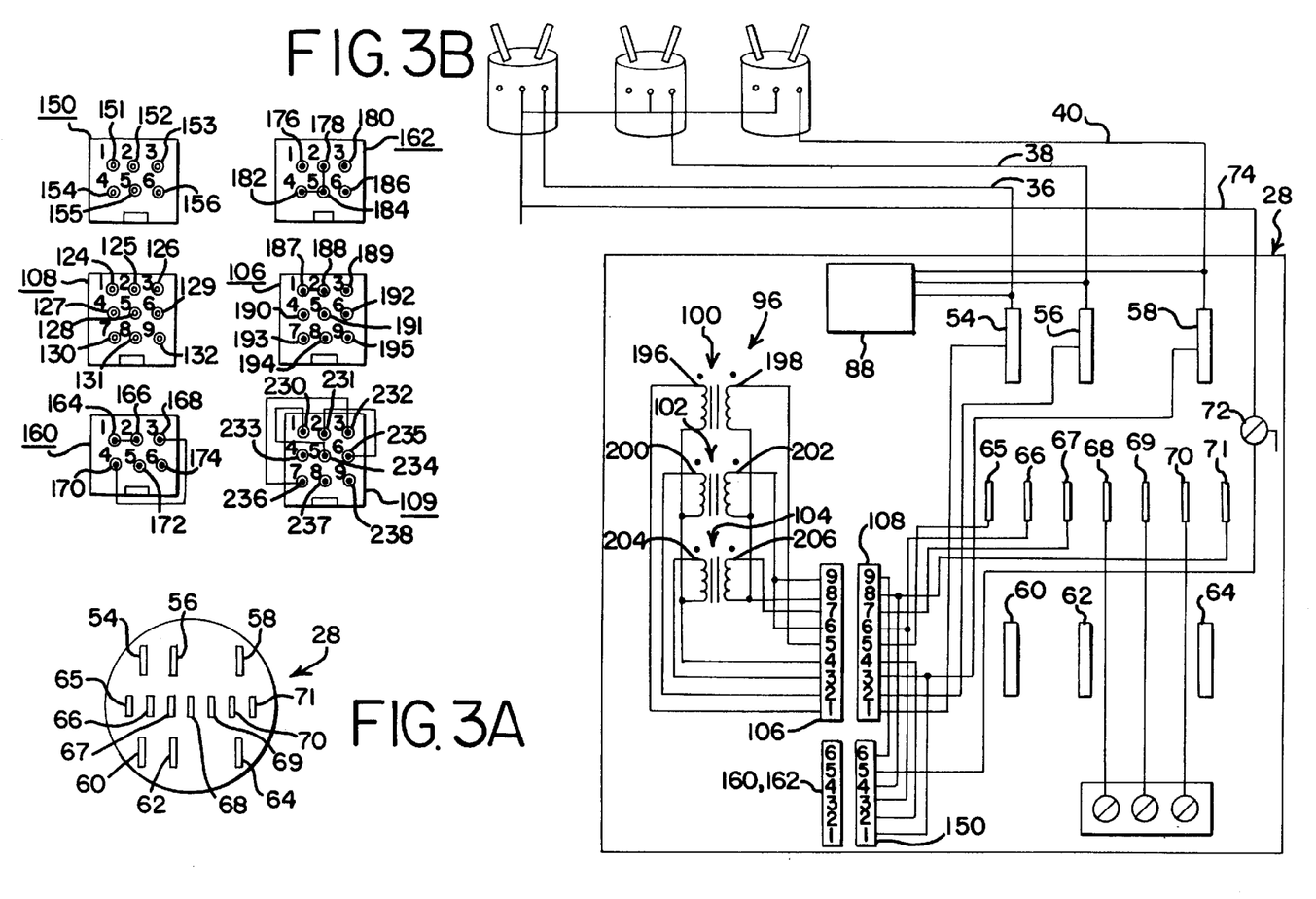
FIG. 3A is a schematic diagram of a 13-terminal meter socket used in connection with the present invention.
FIG. 3B is an electrical schematic diagram of the energy consumption measuring system shown in FIG. 1.

Referring now to the construction and operation of the electrical isolation devices 96, reference will be made to FIGS. 3A and 3B, which show the meter socket 28 in which the self-contained meter 26 of FIG. 1 is received during use and an electrical schematic of the energy consumption measuring system 10, respectively. Referring first to FIG. 3A, the meter socket 28 is shown in schematic form. As shown, the meter socket 28 includes the upper socket terminals 54, 56, 58, the lower socket terminals 60, 62, 64, and the seven additional socket terminals 65–71. Those skilled in the art will appreciate that the meter socket 28 as shown in FIG. 3A is designed to receive a class 200 (or class 320) Form 9S self-contained solid state watthour meter, such as the self-contained watthour meter assembly 26 shown in FIG. 1.

Referring now to FIG. 3B, the energy consumption measuring system 10 is shown in schematic form. For purposes of illustration only, the electrical schematic of FIG. 3B shows the service as having a four wire wye connected source along with voltage transformers. Like reference numerals from FIG. 1 identify counterpart elements in FIG. 3B. As shown, the line-side conductors 36, 38, 40 are in electrical communication with the upper socket terminals 54, 56, 58 of the meter socket 28 through the line-side conductor terminals 32, 34, 36 (FIG. 1). When the self-contained watthour meter assembly 26 (FIG. 1) is received within the meter socket 28, the current sensing windings internal to the meter assembly electrically connect the upper socket terminals 54, 56, 58 with the lower socket terminals 60, 62, 63, respectively, so that energy may be delivered from the power source to the load, which is shown only in legend form in FIG. 3B. All current delivered to the load passes through the current sensing windings inside the housing of the watthour meter assembly 26 (since that meter assembly is-self-contained) so that the current may be accurately measured by the assembly.

As shown, the MOV 88 is wye connected with the line-side conductors 36, 38, 40 to clamp down the voltage across those conductors under extreme conditions to a predetermined limit. Those skilled in the art will appreciate that the use of a metal oxide varistor, such as the MOV 88 shown in the figures, is an optional, but usually desired, feature of the present invention. The presence of the MOV 88 itself is not novel per se and is not intended to limit the scope of the invention defined by the appended claims.

As is further shown in FIG. 3B, plug 108 includes a plurality of nodes 124–132. A plurality of conductors 135, 136, 137 electrically connect the upper socket terminals 54, 56, 58 with nodes 124, 125, 126 of the plug 108. In similar fashion, a plurality of conductors 140, 142, 144 electrically connect the additional socket terminals 65, 66, 67, 71 with nodes 128, 129, 130, 131 of the plug 108.

The additional socket terminals 68, 69, 70 are electrically connected to an array of terminals 145, 146, 147 respectively, of a terminal block 148 included within the meter box 12, typically intended for use as test points or auxiliary connections for the meter.

Further included in the schematic diagram of FIG. 3B, although not shown in FIG. 1, is an application jack generally designated 150. Application jack 150 includes six nodes, namely nodes 151–156. Node 151 of application jack 150 is electrically connected to node 125 of plug 108, upper socket terminal 56 of meter socket 28, and line-side conductor 38. Node 152 of application jack 150 is electrically connected to node 127 of plug 108. Node 153 of application jack 150 is electrically connected to node 129 of plug 108 and additional socket terminal 66 of the meter socket 28. Node 154 of application jack 150 is electrically connected to node 131 of plug 108 and additional socket terminal 71 of the meter socket 28. Node 155 of application jack 150 is electrically connected to line-side neutral conductor 74, as shown. And, finally, node 156 of application jack 150 is electrically connected to node 132 of plug 108.

Further included for use with the present invention are first and second application plugs 160, 162. The first application plug 160 is intended for use when the present invention is used in three wire delta or four wire wye high resistance grounded neutral applications. On the other hand, the second application plug 162 is intended for use when the present invention is used in four wire wye or four wire delta applications. In either case, however, the application plugs are both constructed to matingly engage with application jack 150 and provide electrical communication with respective nodes thereof.

The first application plug 160 includes a plurality of nodes 164, 166, 168, 170, 172 and 174. Nodes 164 and 166 are electrically connected within the first application plug 160; likewise, nodes 168 and 170 are electrically connected within the plug; and, finally, nodes 172 and 174 are electrically connected within the plug.

The second application plug 162 includes a plurality of nodes 176, 178, 180, 182, 184 and 186. Nodes 178, 182 and 184 are all electrically connected together within the second application plug 162.

Those skilled in the art will appreciate that when a Form 9S class 200 (or class 320) self-contained watthour meter, such as the watthour meter assembly 26 shown in FIG. 1, is received within the meter socket 28, voltage across three pairs of socket terminals will be sensed by windings internal to the meter. In particular, a first voltage sensing winding connects the additional socket terminals 65, 71 to each other; a second voltage sensing winding connects the additional socket terminals 66, 71 to each other; and a third voltage sensing winding connects the additional socket terminals 67, 71 to each other.

Still referring to FIG. 3B, the set of electrical isolation devices 96, in this case comprising the three transformers 100, 102, 104, is shown to be electrically connected with respective nodes of the plug 106. Although it is not necessary, the transformers 100, 102, 104 will typically be step-down transformers, each of which has primary and secondary windings. For purposes of discussion only, the transformers 100, 102, 104 will be described as step-down transformers. This discussion, however, is not intended to limit the scope of the appended claims so that they merely cover step-down transformers.

The plug 106 is shown to include a plurality of nodes 187–195. The transformer 100 includes a primary winding 196 and a secondary winding 198. One end of the primary winding 196 is electrically connected to node 187 of the plug 106 and the other end of that winding is electrically connected to a node 190 of the same plug. With respect to the secondary winding 198, one end of that winding is electrically connected with a node 191 of the plug 106 and the other end of that winding is electrically connected with a node 194 of the same plug.

The transformer 102 also includes a primary winding 200 and a secondary winding 202. As shown, one end of the primary winding 200 is electrically connected with a node 188 of the plug 106 and the other end of that winding is electrically connected with the node 190 of the same plug. With respect to the secondary winding 202 of the transformer 102, one end of that winding is electrically connected with nodes 192 and 195 of the plug 106. The other end of the secondary winding 202 of transformer 102 is electrically connected to the node 194 of the plug 106.

The transformer 104 is similar to the other transformers 100, 102 in that it also includes primary and secondary windings 204, 206. As shown, one end of the primary winding 204 is electrically connected with a node 189 of the plug 106 and the other end of that winding is electrically connected with the node 190 of the plug. With respect to the secondary winding 206 of transformer 104, one of its ends is electrically connected with a node 193 of the plug 106 and its other end is electrically connected to the node 194 of the plug.

As shown, when the plug 106 is connected to its mate, namely plug 108, each node of plug 106 is electrically connected to its counterpart in the other plug 108. In particular, nodes 187–195 of plug 106 mate respectively with counterpart nodes 124–132 of plug 108.

In four wire wye and four wire delta applications, the second application plug 162 is matingly engaged with the application jack 150 and the plugs 106, 108 are also matingly engaged to each other. In this application and arrangement, one end of the primary winding 196 of transformer 100 is in electrical communication with the line-side conductor 36 and the other end of that winding is in electrical communication with the line-side neutral conductor 74. Likewise, in transformer 100, one end of the secondary winding 198 is electrically connected to the additional socket terminal 65, and the other end of that winding is connected to both the line-side neutral conductor 74 and the additional socket terminal 71. An important feature of this arrangement is that the voltage sensing winding that electrically connects the additional socket terminals 65, 71 to each other when the watthour meter assembly 26 is in the meter socket 28 is electrically isolated from the line-side conductor 36 by the transformer 100.

Still referring to the above-described arrangement, with respect to the transformer 102, one end of its primary winding 200 is electrically connected with the line-side conductor 38 and the other end of that winding is electrically connected with the line-side neutral conductor 74 and with the additional socket terminal 71. On the other hand, its secondary winding 202 has one end electrically connected with the additional socket terminal 66 and another end electrically connected with the line-side neutral conductor 74 and with the additional socket terminal 71. Here again, the second voltage sensing winding is electrically isolated from the line-side conductor 38 by the transformer 102.

Still referring to the above-described arrangement, with respect to the transformer 104, one end of its primary winding 204 is electrically connected with the line-side conductor 40 and the other end of that winding is electrically connected with the line-side neutral conductor 74 and with the additional socket terminal 71. One end of its secondary winding 206 is electrically connected with the additional socket terminal 67 and the other end of that winding is electrically connected with the line-side neutral conductor 74 and with the additional socket terminal 71 in this arrangement. With this arrangement, the third voltage sensing winding is electrically isolated from the line-side conductor 40 by the voltage transformer 104.

In three wire delta or four wire wye with high resistance grounded neutral applications, the first application plug 160 is matingly engaged with the application jack 150 and the plugs 106, 108 are also matingly engaged to each other. In this arrangement, the primary winding 196 of the transformer 100 has one of its ends electrically connected to the line-side conductor 36. The other of its ends is electrically connected with the line-side conductor 38. Further, in this arrangement, one end of the secondary winding 198 is electrically connected with the additional socket terminal 65 and the other end of that winding is electrically connected with the additional socket terminals 66, 71.

Still referring to the above-described arrangement, with respect to the transformer 102, both ends of its primary winding 200 are electrically connected with the line-side conductor 38. Likewise, both ends of its secondary winding 202 are electrically connected with the line-side conductor 38.

Still referring to this arrangement, with respect to the transformer 104, one end of its primary winding 204 is electrically connected with the line-side conductor 40 and the other end of that winding is electrically connected with the line-side conductor 38. On the other hand, one end of its secondary winding 206 is electrically connected with the additional socket terminal 71 and the other end of that winding is electrically connected with the additional socket terminals 66, 71.

In this arrangement, the additional socket terminals 66, 71 are electrically connected to each other through the nodes of the application jack 150 and the first application plug 160. Furthermore, the additional socket terminals 66, 71 are electrically connected to each other in a direct fashion through the application jack 150 and the first application plug 160. Those skilled in the art will appreciate that, when the watthour meter assembly 26 is received within the meter socket 28, the plug 106 is mated with the plug 108, and the first application plug 160 is mated with the application jack 146, the watthour meter assembly is able to measure the electrical energy consumed by the connected load by taking advantage of the well-known Blondel's Theorem so that only two voltage sensing windings need be internal to the watthour meter, each voltage sensing winding being connected between one of the conductor lines and a common point, namely, the line-side conductor 38. In this arrangement, with respect to the transformer 100, its primary winding 196 is electrically connected between the conductors 36, 38. Similarly, with respect to the transformer 104, its primary winding 204 is electrically connected between conductors 38, 40. As a result, only two voltage sensing windings are required to measure the energy consumed by the load attached to the power system. Furthermore, the first of these two voltage sensing windings is electrically isolated from the conductors 36, 38 by the transformer 100 and the second of these two voltage sensing windings is electrically isolated from the conductors 38, 40 by the transformer 104. Those skilled in the art will further appreciate the benefits of having the first application plug 160 matingly engaged with the application jack 146 when measuring the energy delivered to loads in three wire delta and four wire wye with high resistance grounded neutral applications.

Still referring to FIG. 3B, the jumper 109 of FIG. 1 is also shown in schematic form. As shown, the jumper 109 includes a plurality of nodes generally designated 230–238. As shown, the node 230 is electrically connected with the node 234, the node 231 is electrically connected with the node 235, and the node 232 is electrically connected with the node 236. In this arrangement, when the jumper 109, instead of the plug 108, is mated with the plug 106, the line-side conductor 36 is electrically connected to the additional socket terminal 65 in a direct fashion, the line-side conductor 38 is electrically connected with the additional socket terminal 66 in a direct fashion, and the line-side conductor 40 is electrically connected with the additional socket terminal 67 in a direct fashion. As a result, when the jumper 109 is mated with the plug 106, the energy consumption measuring system 10 is able to operate without the set of electrical isolation devices 96 being associated therewith.

Figure 2:
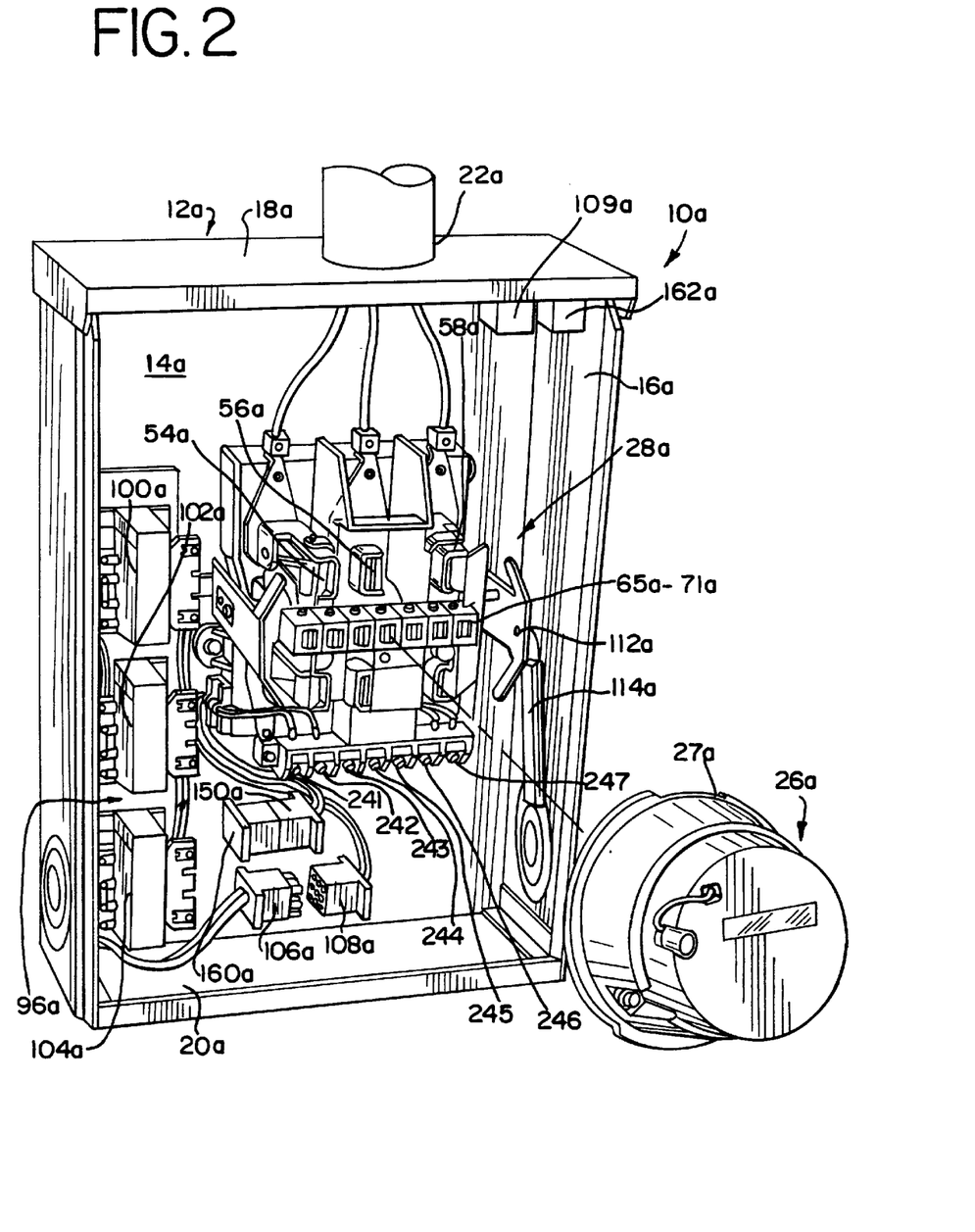
FIG. 2 is a perspective view of an alternate form of an energy consumption measuring system having parts thereof shown in explosion and including the set of three electrical isolation transformers of the present invention.
Figure 4:
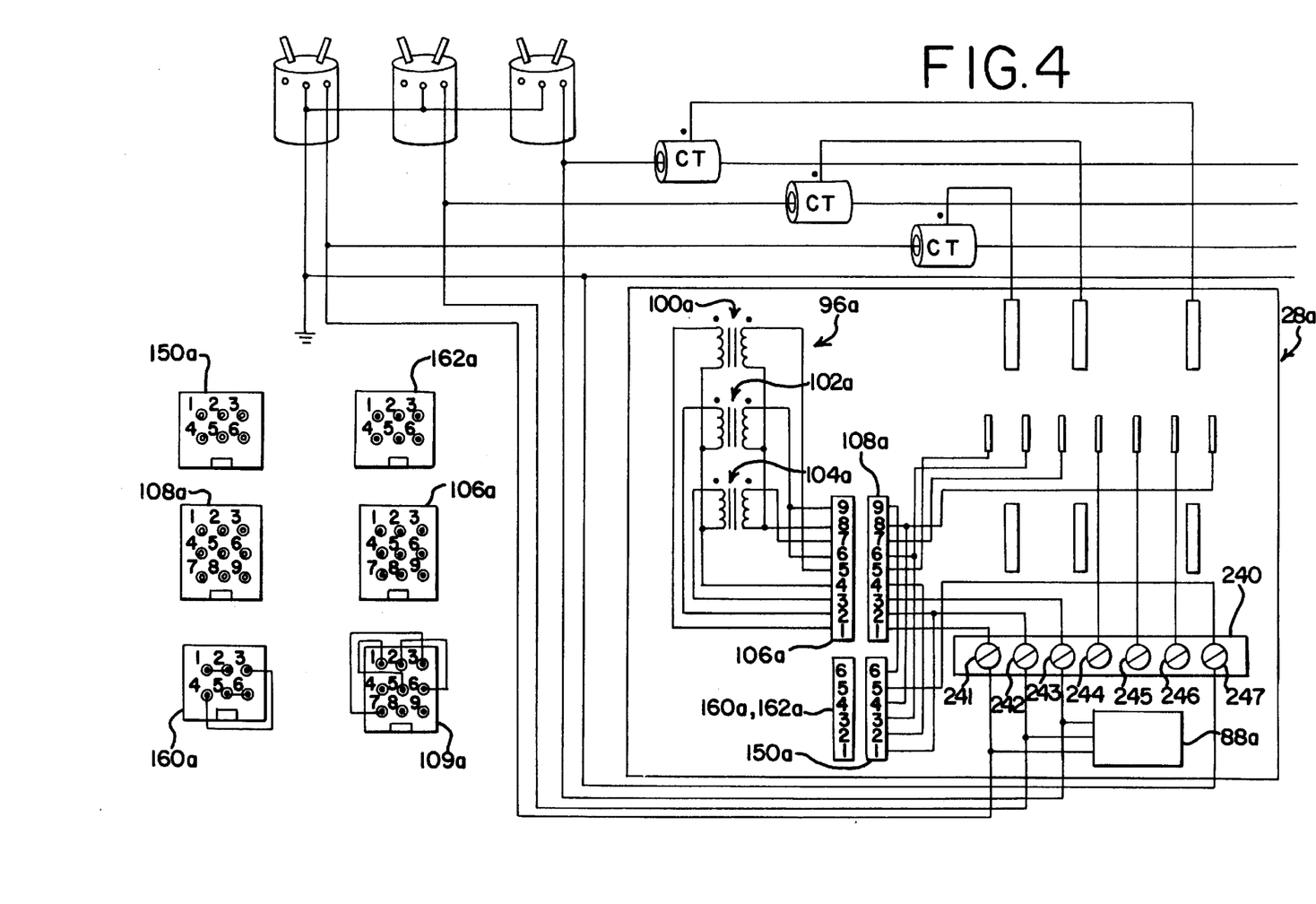
FIG. 4 is an electrical schematic diagram similar to FIG. 3B showing the elements and connections for the alternate form of the energy measuring system shown in FIG. 2.

Referring now to FIGS. 2 and 4, a perspective view of an energy consumption measuring system alternative in form to that of FIGS. 1 and 3 is shown. For purposes of illustration only, the electrical schematic of FIG. 4 shows the service as having a four wire wye connected source along with voltage and current transformers. Like reference numerals shown in FIGS. 2 and 4 relate to similar reference numerals that identify elements in FIGS. 1 and 3. For instance, the energy consumption measuring system 10a of FIGS. 2 and 4 is similar to the energy consumption measuring system 10 of FIGS. 1 and 3. Unless otherwise indicated, the elements shown in FIGS. 2 and 4 are structurally and functionally similar to their counterpart elements shown in FIGS. 1 and 3. Reference should be made both to FIG. 2 and FIG. 4 in order to understand the following detailed description regarding use of the present invention in an energy consumption measuring system alternative to that shown in FIGS. 1 and 3.

Referring still to FIGS. 2 and 4, the major difference between those figures and FIGS. 1 and 3 is that a watthour meter assembly generally designated 26a comprises an instrument transformer rated watthour meter rather than a self-contained watthour meter as shown in FIGS. 1 and 3. Based on this difference, some of the other elements of FIGS. 2 and 4 differ from their counterpart elements identified in FIGS. 1 and 3. For instance, line-side conductors 36a, 38a, 40a are not directly connected to the lines of the power system, but rather are connected to secondary windings of current transformers, which, in turn, are directly connected to the lines of the power system. As shown, line-side conductors 36a, 38a, 40a are generally smaller in diameter than their counterpart conductors shown in FIGS. 1 and 3, since, as is the usual case with instrument transformer rated watthour meters, these conductors carry current of a lower magnitude than they would carry if they were directly connected to the lines of the power system, such as when a self-contained watthour meter system is used.

Other differences are that plug 108a and application jack 150a are electrically connected to the voltage side of the power lines through a terminal block 240 having a plurality of terminals 241–247, as shown. In the embodiment shown in FIG. 4, the plug 108a and the application jack 150a are further electrically connected to the secondary windings of a set of voltage transformers external to the meter box 12a. These external voltage transformers reduce the voltage levels applied to the primary windings 196a, 200a, 204a of voltage transformers 100a, 102a, 104a, respectively. The voltage transformers 100a, 102a, 104a, in turn, further reduce the voltage levels applied to the voltage sensing windings internal to the watthour meter assembly 26a when that assembly is received within the meter socket 28a. Those skilled in the art will appreciate that advantages may be obtained through use of the present invention regardless of whether or not external transformers are included within the power system.

The MOV 88a may optionally be wye connected directly to the electrical power lines, or alternatively, to those lines through the secondary windings of the above-described voltage transformers.

The set of electrical isolation devices 96a is shown to include in this case the three transformers 100a, 102a, 104a. The transformer 100a includes primary and secondary windings 196a, 198a, which are electrically connected with respective nodes of a plug 106a. The connection of these windings is identical to the connections described with reference to FIGS. 1 and 3.

Referring again to FIGS. 2 and 4, the jumper 109a is shown having nodes that are electrically connected in an identical manner to that described with reference to FIGS. 1 and 3. The jumper 109a will typically be used in the electrical energy consumption measuring system 10a when that system is already connected to the secondary windings of voltage transformers external to meter box 12a rather than directly connected to the service voltage of the power lines, although those skilled in the art will appreciate that this need not be the case. On the other hand, the plug 106a and the plug 108a may be connected to each other when the electrical energy consumption measuring system 10a is directly connected to the service voltage of the power lines.

Outside of these modifications for this alternative embodiment of the present invention, the energy measuring system shown in FIGS. 2 and 4 is structurally and functionally similar to the energy measuring system shown in FIGS. 1 and 3.

It will thus be seen the present invention provides a new and improved watthour meter system having a number of advantages and characteristics, including those pointed out herein and others which are inherent in the invention. Several preferred embodiments having been described by way of illustration, it is anticipated that modifications to the described forms of product will occur to those skilled in the art and that such modification and changes may be made without departing from the spirit of the invention or the scope of the appended claims.

I claim:

1. An electrical energy consumption measuring system, comprising:

an electrical meter having voltage sensing means internal thereto and further having current sensing means internal thereto, each of said voltage sensing means being constructed and arranged so that the electrical meter may measure a first voltage appearing across that voltage sensing means and determine therefrom a second voltage appearing across at least two lines of an electrical circuit system, each of said current sensing means being constructed and arranged so that the electrical meter may measure a first current driven through that current sensing means and determine a second current driven through a line of said electrical circuit system, said voltage and said current in the electrical circuit system being required for energy measurement;

said electrical meter further having conductor lugs for connection with socket terminals of a meter socket;

a meter socket adapted to receive said electrical meter, said meter socket having a plurality of socket terminals which are designed to receive a plurality of said conductor lugs of said electrical meter when said plurality of said conductor lugs are in registry with said plurality of socket terminals;

a first jack including a first plurality of nodes, said first jack carrying a first plurality of conductors including a conductor for each of a plurality of associated socket terminals, each of said first plurality of conductors having one end electrically connected with a given one of said first plurality of nodes of said first jack, each of said first plurality of conductors further having its other end electrically connected to a given one of said socket terminals;

an electrical isolation device;

a first plug including a second plurality of nodes, said first plug being adapted to be connected with said first jack;

a second plurality of conductors, each of said second plurality of conductors having one of its ends electrically connected to a given one of said second plurality of nodes, each of said second plurality of conductors further having its other end electrically connected to said electrical isolation device;

said first plurality of nodes of said first jack and said second plurality of nodes of said first plug constructed and arranged such that when said first plug and said first jack are connected to each other and said electrical meter is energized, said electrical isolation device electrically isolates said voltage sensing means of said electrical meter from said electrical circuit.

2. The electrical energy consumption measuring system of claim 1 further comprising a meter box of sufficient volume to accommodate said electrical isolation device during operation of said system.

3. The electrical energy consumption measuring system of claim 1 further comprising a second plug including a third plurality of nodes, said second plug being adapted to be connected with said first jack.

4. The electrical energy consumption measuring system of claim 3 wherein said second plug is connected with said first jack to enable said system to operate without use of said electrical isolation device.

5. The electrical energy consumption measuring system of claim 1 further comprising an application jack including a third plurality of nodes, selected ones of said third plurality of nodes being in electrical communication with said first plurality of nodes of said first jack.

6. The electrical energy consumption measuring system of claim 5 further comprising a first application plug including a fourth plurality of nodes, said first application plug being adapted to connect with said application jack.

7. The electrical energy consumption measuring system of claim 6 wherein said first application plug is constructed for connection with said application jack when said electrical circuit system is a three wire system having a delta connected source.

8. The electrical energy consumption measuring system of claim 7 wherein said first application plug is likewise constructed for connection with said application jack when said electrical circuit system is a four wire system having a high resistance grounded neutral and a wye connected source.

9. The electrical energy consumption measuring system of claim 6 further comprising a second application plug including a fifth plurality of nodes, said second application plug being adapted to be connected with said application jack.

10. The electrical energy consumption measuring system of claim 9 wherein said second application plug is constructed for connection with said application jack when said electrical circuit system is a four wire system having a wye connected source.

11. The electrical energy consumption measuring system of claim 10 wherein said second application plug is likewise constructed for connection with said application jack when said electrical circuit system is a four wire system having a delta connected source.

12. The electrical energy consumption measuring system of claim 1 wherein said electrical meter comprises a self-contained meter.

13. The electrical energy consumption measuring system of claim 12 wherein said self-contained meter comprises a Class 200 meter.

14. The electrical energy consumption measuring system of claim 12 wherein said self-contained meter comprises a Class 320 meter.

15. The electrical energy consumption measuring system of claim 1 wherein said electrical meter comprises a transformer rated meter.

16. The electrical energy consumption measuring system of claim 15 wherein said transformer rated meter comprises a Class 20 meter.

17. An electrical energy consumption measuring system, comprising:

an electrical meter having voltage sensing windings internal thereto and further having current sensing windings internal thereto, each of said voltage sensing windings being constructed and arranged so that the electrical meter may measure a first voltage appearing across that voltage sensing winding and determine a second voltage appearing across at least two lines of an electrical circuit system, each of said current sensing windings being constructed and arranged so that the electrical meter may measure a first current driven through that current sensing winding and determine a second current driven through a line of said electrical circuit system;

said electrical meter further having conductor lugs for connection with socket terminals of a meter socket;

a meter socket adapted to receive said electrical meter, said meter socket having a plurality of socket terminals which are designed to receive a plurality of said conductor lugs of said electrical meter when said plurality of said conductor lugs are in registry with said plurality of socket terminals;

a first jack including a first plurality of nodes, said first plug carrying a first plurality of conductors including a conductor for each of a plurality of associated socket terminals, each of said first plurality of conductors having one end electrically connected with a given one of said first plurality of nodes of said first jack, each of said first plurality of conductors further having its other end electrically connected to a given one of said socket terminals;

a set of voltage transformers, each of said voltage transformers having a primary winding and a secondary winding;

a first plug including a second plurality of nodes, said first plug being adapted to be connected with said first jack;

a second plurality of conductors, each of said second plurality of conductors having one of its ends electrically connected to a given one of said second plurality of nodes, each of said second plurality of conductors further having its other end electrically connected to a given one of said windings of said set of voltage transformers;

said first plurality of nodes of said first jack and said second plurality of nodes of said first plug constructed and arranged such that when said first jack and said first plug are connected to each other and said electrical meter is energized, said set of voltage transformers electrically isolates said voltage sensing windings of said electrical meter from said electrical circuit.

18. The electrical energy consumption measuring system of claim 17 wherein each of said secondary windings of said set of voltage transformers has the same as or fewer turns than its associated primary winding.

19. The electrical energy consumption measuring system of claim 18 wherein said set of voltage transformers ensures that said first voltage appearing across each of said voltage sensing windings is the same or lower in magnitude than said second voltage appearing across the two lines of said electrical circuit system that are associated with that voltage sensing winding.

20. The electrical energy consumption measuring system of claim 17 further comprising a meter box of sufficient volume to accommodate said set of voltage transformers during operation of said system.

21. The electrical energy consumption measuring system of claim 17 further comprising a second plug including a third plurality of nodes, said second plug being adapted to be connected with said first jack.

22. The electrical energy consumption measuring system of claim 21 wherein said second plug is connected with said first jack to enable said system to operate without use of said set of voltage transformers.

23. The electrical energy consumption measuring system of claim 17 further comprising an application jack including a third plurality of nodes, selected ones of said third plurality of nodes being in electrical communication with said first plurality of nodes of said first jack.

24. The electrical energy consumption measuring system of claim 23 further comprising a first application plug including a fourth plurality of nodes, said first application plug being adapted to connect with said application jack.

25. The electrical energy consumption measuring system of claim 24 wherein said first application plug is constructed for connection with said application jack when said electrical circuit system is a three wire system having a delta connected source.

26. The electrical energy consumption measuring system of claim 25 wherein said first application plug is likewise constructed for connection with said application jack when said electrical circuit system is a four wire system having a high resistance grounded neutral and a wye connected source.

27. The electrical energy consumption measuring system of claim 24 further comprising a second application plug including a fifth plurality of nodes, said second application plug being adapted to be connected with said application jack.

28. The electrical energy consumption measuring system of claim 27 wherein said second application plug is constructed for connection with said application jack when said electrical circuit system is a four wire system having a wye connected source.

29. The electrical energy consumption measuring system of claim 28 wherein said second application plug is likewise constructed for connection with said application jack when said electrical circuit system is a four wire system having a delta connected source.

30. The electrical energy consumption measuring system of claim 17 wherein said electrical meter comprises a self-contained meter.

31. The electrical energy consumption measuring system of claim 30 wherein said self-contained meter comprises a Class 200 meter.

32. The electrical energy consumption measuring system of claim 30 wherein said self-contained meter comprises a Class 320 meter.

33. The electrical energy consumption measuring system of claim 17 wherein said electrical meter comprises a transformer rated meter.

34. The electrical energy consumption measuring system of claim 33 wherein said transformer rated meter comprises a Class 20 meter.

35. An electrical energy consumption measuring system, comprising:

an electrical meter having three voltage sensing windings internal thereto and further having three current sensing said three internal thereto, each of said three voltage sensing windings being constructed and arranged so that the electrical meter may measure a first voltage appearing across that voltage sensing winding and determine a second voltage appearing across at least two lines of an electrical circuit system, each of said three current sensing windings being constructed and arranged so that the electrical meter may measure a first current driven through that current sensing winding and determine a second current driven through a line of said electrical circuit system;

said electrical meter further having thirteen conductor lugs for connection with socket terminals of a meter socket;

a meter socket adapted to receive said electrical meter, said meter socket having thirteen socket terminals which are designed to receive said thirteen conductor lugs of said electrical meter when said thirteen conductor lugs are in registry with said thirteen socket terminals;

a first jack including a first plurality of nodes, said first jack carrying a first plurality of conductors including a conductor for each of a plurality of associated socket terminals, each of said first plurality of conductors having one end electrically connected with a given one of said first plurality of nodes of said first jack, each of said first plurality of conductors further having its other end electrically connected to a given one of said thirteen socket terminals;

a set of three voltage transformers, each of said three voltage transformers having a primary winding and a secondary winding, said secondary winding of each of said three voltage transformers having fewer turns than its associated primary winding;

a first plug including a second plurality of nodes, said first plug being adapted to be connected with said first jack;

a second plurality of conductors, each of said second plurality of conductors having one of its ends electrically connected to a given one of said second plurality of nodes, each of said second plurality of conductors further having its other end electrically connected to a given one of said windings of said set of three voltage transformers;

said first plurality of nodes of said first jack and said second plurality of nodes of said first plug constructed and arranged such that when said first jack and said first plug are connected to each other and said meter is energized, said set of three voltage transformers electrically isolates said three voltage sensing windings of said electrical meter from said electrical circuit and further ensures that said first voltage appearing across each one of said three voltage sensing windings is lower in magnitude than said second voltage appearing across the two lines of said electrical circuit system that are associated with that voltage sensing winding;

a meter box of sufficient volume to accommodate said set of three voltage transformers during operation of said system;

a second plug including a third plurality of nodes, said second plug being adapted to be connected with said first jack, said second plug constructed for connection with said first jack to enable said system to operate without use of said set of three voltage transformers;

an application jack including a fourth plurality of nodes, selected ones of said fourth plurality of nodes being in electrical communication with said first plurality of nodes of said first jack;

a first application plug including a fifth plurality of nodes, said first application plug being adapted to connect with said application jack and further being constructed for connection with said application jack when said electrical circuit system is a three wire system having a delta connected source, said first application plug likewise being constructed for connection with said application jack when said electrical system is a four wire system having a high resistance grounded neutral and a wye connected source; and a second application plug including a sixth plurality of nodes, said second application plug being adapted to be connected with said application jack, said second application plug being constructed for connection with said application jack when said electrical circuit system is a four wire system having a wye connected source, said second application plug further being constructed for connection with said application jack when said electrical circuit system is a four wire system having a delta connected source.

36. The electrical energy consumption measuring system of claim 35 wherein said electrical meter comprises a self-contained meter.

37. The electrical energy consumption measuring system of claim 36 wherein said self-contained meter comprises a Class 200 meter.

38. The electrical energy consumption measuring system of claim 36 wherein said self-contained meter comprises a Class 320 meter.

39. The electrical energy consumption measuring system of claim 35 wherein said electrical meter comprises a transformer rated meter.

40. The electrical energy consumption measuring system of claim 39 wherein said transformer rated meter comprises a Class 20 meter.

* * * * *